United States Patent
Lewis

(10) Patent No.: US 10,027,327 B2
(45) Date of Patent: *Jul. 17, 2018

(54) ROUTING AND PROGRAMMING FOR RESISTIVE SWITCH ARRAYS

(71) Applicant: Altera Corporation, San Jose, CA (US)

(72) Inventor: David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/227,718

(22) Filed: Aug. 3, 2016

(65) Prior Publication Data
US 2016/0344390 A1 Nov. 24, 2016

Related U.S. Application Data

(60) Continuation of application No. 14/886,777, filed on Oct. 19, 2015, now Pat. No. 9,432,023, which is a (Continued)

(51) Int. Cl.
*H03K 19/173* (2006.01)
*G11C 13/00* (2006.01)
(Continued)

(52) U.S. Cl.
CPC ....... *H03K 19/1732* (2013.01); *G01R 21/133* (2013.01); *G11C 13/0002* (2013.01);
(Continued)

(58) Field of Classification Search
None
See application file for complete search history.

(56) References Cited

U.S. PATENT DOCUMENTS

| | | |
|---|---|---|
| 4,870,302 A | 9/1989 | Freeman |
| 5,243,238 A | 9/1993 | Kean |

(Continued)

FOREIGN PATENT DOCUMENTS

| | | |
|---|---|---|
| CN | 101447787 A | 6/2009 |
| JP | 2008236756 A | 10/2008 |

(Continued)

OTHER PUBLICATIONS

Betz et al., "Architecture and CAD for Deep-Submicron FPGAs", Mar. 1999, Chapters 2, 4, 5 and 7, pp. 11-19, 63-103, 105-126, and 151-190, Kluwer Academic Publishers.

(Continued)

*Primary Examiner* — Minh D A
*Assistant Examiner* — James H Cho

(57) ABSTRACT

Various structures and methods are disclosed related to routing and programming circuitry on integrated circuits ("IC") that have arrays of programmable resistive switches. In some embodiments, routing structures utilize densely populated resistive switch arrays to provide for efficient selection circuits that route into and out of logic regions. In other embodiments, programming circuitry is provided to help maintain relatively consistent programming current throughout an array of resistive switches to be programmed. In other embodiments, methods are provided for programming resistive switches without violating given power constraints. These and other embodiments are described further herein.

11 Claims, 11 Drawing Sheets

Related U.S. Application Data division of application No. 13/466,847, filed on May 8, 2012, now Pat. No. 9,166,598.

(51) Int. Cl.
*H03K 19/177* (2006.01)
*G01R 21/133* (2006.01)

(52) U.S. Cl.
CPC ...... *G11C 13/0026* (2013.01); *G11C 13/0028* (2013.01); *G11C 13/0069* (2013.01); *H03K 19/1737* (2013.01); *H03K 19/1776* (2013.01); *H03K 19/17736* (2013.01); *G11C 2213/77* (2013.01); *H03K 19/17728* (2013.01)

(56) References Cited

U.S. PATENT DOCUMENTS

| | | | |
|---|---|---|---|
| 5,260,611 A | 11/1993 | Cliff et al. | |
| 5,455,525 A | 10/1995 | Ho et al. | |
| 5,485,103 A | 1/1996 | Leong et al. | |
| 5,537,057 A | 7/1996 | Cliff et al. | |
| 5,541,530 A | 7/1996 | Cliff et al. | |
| 5,581,199 A | 12/1996 | Pierce et al. | |
| 5,592,106 A | 1/1997 | Leong et al. | |
| 5,682,107 A | 10/1997 | Tavana et al. | |
| 5,689,185 A | 11/1997 | Cliff et al. | |
| 5,701,091 A | 12/1997 | Kean | |
| 5,705,939 A | 1/1998 | McClintock et al. | |
| 5,847,579 A | 12/1998 | Trimberger | |
| 5,880,598 A | 3/1999 | Duong | |
| 5,907,248 A | 5/1999 | Bauer et al. | |
| 5,909,126 A | 6/1999 | Cliff et al. | |
| 5,914,616 A | 6/1999 | Young et al. | |
| 5,942,913 A | 8/1999 | Young et al. | |
| 5,966,027 A | 10/1999 | Kapusta et al. | |
| 6,084,429 A | 7/2000 | Trimberger | |
| 6,107,824 A | 8/2000 | Reddy et al. | |
| 6,204,690 B1 | 3/2001 | Young et al. | |
| 6,249,149 B1* | 6/2001 | Pedersen | G06F 1/10 326/39 |
| 6,278,291 B1 | 8/2001 | McClintock et al. | |
| 6,292,018 B1 | 9/2001 | Kean | |
| 6,300,794 B1 | 10/2001 | Reddy et al. | |
| 6,492,834 B1* | 12/2002 | Lytle | H03K 19/17728 326/41 |
| 6,670,825 B1 | 12/2003 | Lane et al. | |
| 6,696,855 B1 | 2/2004 | Kapusta et al. | |
| 6,864,710 B1 | 3/2005 | Lacey et al. | |
| 6,970,014 B1 | 11/2005 | Lewis et al. | |
| 7,256,613 B1 | 8/2007 | Sharpe-Geisler et al. | |
| 7,280,392 B2 | 10/2007 | Liaw et al. | |
| 7,456,653 B2* | 11/2008 | Lewis | H03K 19/17736 326/39 |
| 7,702,978 B2 | 4/2010 | Lewis et al. | |
| 8,238,174 B2 | 8/2012 | Yan et al. | |
| 8,497,702 B2 | 7/2013 | Hill et al. | |
| 8,890,567 B1 | 11/2014 | Lewis | |
| 9,166,598 B1 | 10/2015 | Lewis | |
| 2003/0141898 A1* | 7/2003 | Langhammer | G06F 7/5095 326/40 |
| 2007/0164785 A1 | 7/2007 | He | |
| 2007/0210826 A1* | 9/2007 | Madurawe | H03K 19/17796 326/38 |
| 2008/0218208 A1* | 9/2008 | Lewis | H03K 19/17736 326/41 |
| 2008/0231317 A1* | 9/2008 | Cashman | H03K 19/17796 326/41 |
| 2008/0291723 A1 | 11/2008 | Wang et al. | |
| 2010/0246246 A1 | 9/2010 | Kim et al. | |
| 2012/0069633 A1 | 3/2012 | Katch | |
| 2012/0075907 A1* | 3/2012 | Jo | G11C 11/22 365/148 |
| 2012/0221919 A1 | 8/2012 | Ekas et al. | |
| 2013/0135008 A1 | 5/2013 | Zhang et al. | |
| 2013/0148405 A1 | 6/2013 | Kang et al. | |

FOREIGN PATENT DOCUMENTS

| | | |
|---|---|---|
| JP | 2009124175 A | 6/2009 |
| WO | 2009123090 A1 | 10/2009 |
| WO | 2011/066650 A1 | 6/2011 |

OTHER PUBLICATIONS

Tada et al., "Highly Scalable Nonvolatile TiOx/TaSiOy Solid-electrolyte Crossbar Switch Integrated in Local Interconnect for Low Power Reconfigurable Logic", IEEE, 2009, pp. 943-946.

Sakamoto et al., "A Ta2O5 solid-electrolyte switch with improved reliability", Symposium on VLSI Technology Digest of Technical Papers, 2007, pp. 38 and 39.

* cited by examiner

|     | 801 Bits to program | 802 Vector 1 | 803 Remaining bits to program | 804 Vector 2 | 805 Remaining bits to program | 806 Vector 3 | 807 Remaining bits to program |
|-----|---|---|---|---|---|---|---|
| R0  | 0 | 0 | 0 | 0 | 0 | 0 | 0 |
| R1  | 1 | 1 | 0 | 0 | 0 | 0 | 0 |
| R2  | 1 | 1 | 0 | 0 | 0 | 0 | 0 |
| R3  | 0 | 0 | 0 | 0 | 0 | 0 | 0 |
| R4  | 1 | 0 | 1 | 1 | 0 | 0 | 0 |
| R5  | 0 80 | 0 | 0 | 0 | 0 | 0 | 0 |
| R6  | 1 | 0 | 1 | 1 | 0 | 0 | 0 |
| R7  | 1 | 0 | 1 | 0 | 1 | 1 | 0 |
| R8  | 0 | 0 | 0 | 0 | 0 | 0 | 0 |
| R9  | 0 | 0 | 0 | 0 | 0 | 0 | 0 |
| R10 | 1 | 1 | 0 | 0 | 0 | 0 | 0 |
| R11 | 0 | 0 | 0 | 0 | 0 | 0 | 0 |
| R12 | 0 | 0 | 0 | 0 | 0 | 0 | 0 |
| R13 | 0 | 0 | 0 | 0 | 0 | 0 | 0 |
| R14 | 1 81 | 1 | 0 | 0 | 0 | 0 | 0 |
| R15 | 1 | 0 | 1 | 1 | 0 | 0 | 0 |
| R16 | 0 | 0 | 0 | 0 | 0 | 0 | 0 |
| R17 | 0 | 0 | 0 | 0 | 0 | 0 | 0 |
| R18 | 1 | 0 | 1 | 1 | 0 | 0 | 0 |
| R19 | 0 | 0 | 0 | 0 | 0 | 0 | 0 |
| R20 | 0 | 0 | 0 | 0 | 0 | 0 | 0 |
| R21 | 0 | 0 | 0 | 0 | 0 | 0 | 0 |
| R22 | 1 | 1 | 0 | 0 | 0 | 0 | 0 |
| R23 | 0 | 0 | 0 | 0 | 0 | 0 | 0 |
| R24 | 0 | 0 | 0 | 0 | 0 | 0 | 0 |
| R25 | 1 82 | 0 | 1 | 1 | 0 | 0 | 0 |
| R26 | 1 | 0 | 1 | 0 | 1 | 1 | 0 |
| R27 | 1 | 0 | 1 | 0 | 1 | 1 | 0 |
| R28 | 0 | 0 | 0 | 0 | 0 | 0 | 0 |
| R29 | 0 | 0 | 0 | 0 | 0 | 0 | 0 |
| R30 | 0 | 0 | 0 | 0 | 0 | 0 | 0 |
| R31 | 1 | 0 | 1 | 0 | 1 | 1 | 0 |
| R32 | 0 | 0 | 0 | 0 | 0 | 0 | 0 |
| R33 | 0 | 0 | 0 | 0 | 0 | 0 | 0 |
| R34 | 0 | 0 | 0 | 0 | 0 | 0 | 0 |
| R35 | 0 83 | 0 | 0 | 0 | 0 | 0 | 0 |
| R36 | 0 | 0 | 0 | 0 | 0 | 0 | 0 |
| R37 | 0 | 0 | 0 | 0 | 0 | 0 | 0 |
| R38 | 0 | 0 | 0 | 0 | 0 | 0 | 0 |
| R39 | 1 | 0 | 1 | 0 | 1 | 1 | 0 |

|  | 901 Row cost | 902 Bits to program | 903 Vector 1 | 904 Bits remaining to program | 905 Vector 2 | 906 Bits remaining to program | 907 Vector 3 | 908 Bits remaining to program |
|---|---|---|---|---|---|---|---|---|
| R0 | 1   | 0 | 0 | 0 | 0 | 0 | 0 | 0 |
| R1 | 1.1 | 1 | 0 | 1 | 1 | 0 | 0 | 0 |
| R2 | 1.2 | 1 | 1 | 0 | 0 | 0 | 0 | 0 |
| R3 | 1.3 | 0 | 0 | 0 | 0 | 0 | 0 | 0 |
| R4 | 1.4 | 1 | 0 | 1 | 0 | 1 | 1 | 0 |
| R5 | 1.5 | 1 | 0 | 1 | 0 | 1 | 1 | 0 |
| R6 | 1.6 | 0 | 0 | 0 | 0 | 0 | 0 | 0 |
| R7 | 1.7 | 1 | 0 | 1 | 1 | 0 | 0 | 0 |
| R8 | 1.8 | 1 | 1 | 0 | 0 | 0 | 0 | 0 |
| R9 | 1.9 | 0 | 0 | 0 | 0 | 0 | 0 | 0 |

ROUTING AND PROGRAMMING FOR RESISTIVE SWITCH ARRAYS

CROSS REFERENCE TO RELATED APPLICATIONS

This application is a continuation of U.S. patent application Ser. No. 14/886,777, filed Oct. 19, 2015, which is a division of U.S. application Ser. No. 13/466,847, filed May 8, 2012, now U.S. Pat. No. 9,166,598, both of which are hereby incorporated by reference herein in their entireties.

BACKGROUND

Resistive switching elements, such as electrolytic elements using conductive bridges, have been proposed as replacements for the configuration random access memory ("CRAM") and pass gate transistor switches commonly found in integrated circuits ("ICs") that have programmable elements. An example of such an IC is a field programmable gate array ("FPGAs"). Resistive switching elements are not necessarily limited to conductive bridge devices and the terms "resistive switches" and "programmable resistive switches" as used herein refer generally to a resistive element than can be configured to operate in one of at least two modes including a high impedance mode (where the resistive element essentially acts as a switch in an OFF state) and a low impedance mode (where the resistive element essentially acts as a switch in an ON state).

In past FPGA routing architectures, various levels of selection circuits (e.g., multiplexers or "muxes") have been used to route signals between the main routing lines (e.g., horizontal and vertical channels of lines that span logic regions, e.g., logic array blocks or "LABs") and the logic element inputs within each LAB. For example, in some architectures, a first level of mux into a LAB (sometimes referred to as a LAB input mux or "LIM") can be programmed to select signals from a subset of routing lines and then a subset of the lines selected by the LIM can be selected by programming a second level mux, which is sometimes referred to as a logic element input mux or "LEIM"). A separate mux (sometimes referred to as a driver input mux or "DIM") selects output from the logic element outputs and provides it to routing line drivers. In some implementations, the DIM may also select input from other routing lines in addition to selecting input from a local LABs outputs.

The programmable switches for selection circuits such as the LIMs, LEIMs, and DIMs described above have often been implemented with a CRAM element coupled to a pass gate transistor, the CRAM element holding a "1" or "0" that controls the transistor to be either on or off.

CRAM elements for programming selection circuits and for use in programming logic elements typically comprise a programmable array across a programming region of the FPGA. In a typical implementation, the array is programmed one column at a time. During a programming cycle, one column is selected (based on address data in an address register) and row programming data that has been loaded into data register elements is moved into the CRAM elements in the selected column. Within a programming region, an entire column of CRAM is programmed in a single clock cycle and such programming requires relatively little power. The column is selected using a single driver in conjunction with an address register.

Given the die cost of CRAM elements and associated pass gate transistors, existing routing structures typically only provide potential connections for a small subset of the routing resources in the vicinity of a LAB into that LAB's logic resources. For example, in some implementations, although substantially all of the routing lines in horizontal and vertical channels adjacent to a LAB are connected to a LIM input in that LAB, the LAB's LIM switch population only provides for about 5% of the possible LIM input to output connections.

Embodiments of the invention arise in this context.

SUMMARY

Although demonstration circuits have been implemented including a few hundred or even a few thousand resistive switches, an Field Programmable Gate Array ("FPGA") that makes practical use of programmable resistive switches would utilize resistive switch arrays that are orders of magnitude larger in terms of number of elements than the number of elements contained in the demonstration circuits implemented to date. Such an FPGA based on resistive switch arrays has not previously been implemented.

In contrast to the combination of configuration random access memory ("CRAM") elements and pass transistor switches used in prior FPGAs, resistive switches offer the advantage of being much smaller. Also, they may be located high in the process stack and consume effectively no additional area on the die. Therefore, it is efficient to use large amounts of resistive switches in densely populated arrays in an FPGA. This can allow for a much higher percentage of the potential connections between routing resources and logic elements to be available for programmable selection. In one aspect, an embodiment of the present invention provides routing into and out of a logic region (for example, logic elements within a logic array block or "LAB") using a single level of programmable selection circuitry. In one embodiment, the single level of programmable selection circuitry comprises a single selection array in which any input can be selected for any output. In another embodiment, the single level of programmable selection circuitry comprises two or more parallel selection arrays. In one variation of this embodiment, some but not all of a set of routing resource are provided to each of the two or more parallel selection arrays. In one embodiment, routing channels on two sides of a logic region provide input to the single level of programmable selection circuitry and routing channels on three sides of the logic region receive output from the logic region through the programmable selection circuitry.

The resistive switches (those used for selection circuitry and those used for logic elements) in an FPGA may be part of a large array of resistive switches coupled to programming circuitry. Programming a large resistive switch array presents challenges that are not present when programming an array of CRAM elements. Resistive switches are programmed to be on (sometimes referenced herein as "on-programmed" or simply "programmed") by passing a sufficient current through the resistive element for a sufficient period of time. Significant loads can result on column lines used for programming, particularly if a large number of switches are to be "on-programmed" within the same column. Such loading can lead to non-uniform voltages along the column lines with voltages dropping for connections to resistive switches in rows that are further from the column line programming driver. This can result in longer programming times being required to program such switches.

In one embodiment of the present invention, programming circuitry is provided such that a column to be programmed is coupled to local column drivers in a plurality of local regions within a programming region of the FPGA. In one variation, each local column programming driver (which drives a local column line) within a local region is coupled to a local region power buffer that provides a supply voltage.

In another embodiment of the present invention, row or column programming drivers include current source drivers. For example, in an embodiment in which voltage source programming drivers are used to provide programming voltages to column lines, using current source drivers as programming drivers on the row lines can help maintain a uniform current through resistive switches even if those switches are further down the column line and therefore receive a lower voltage level from the column line.

In another embodiment, a method and associated computer program product is provided for programming switches using one or more programming vectors such that the entire column of switches to be programmed is, if necessary, programmed in steps over multiple programming cycles. In one embodiment, particular power constraints are used as part of determining the programming vectors. In a particular embodiment, a method is adaptable to reduce the number of vectors when accounting for power costs against the constraint that vary depending on which row is to be on-programmed.

These and other embodiments are described more fully below. For purposes of illustration only, several aspects of particular embodiments of the invention are described by reference to the following figures.

BRIEF DESCRIPTION OF THE DRAWINGS

FIG. 8 is a table illustrating sample programming vectors generated for programming a column of resistive switches applying the method of FIG. 7 in view of a given power constraint.

FIG. 9 is another table illustrating sample programming vectors generated for programming a column of resistive switches applying the method of FIG. 7 in view of another given power constraint and accounting for different power costs depending on the row in which a resistive switch resides.

DETAILED DESCRIPTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
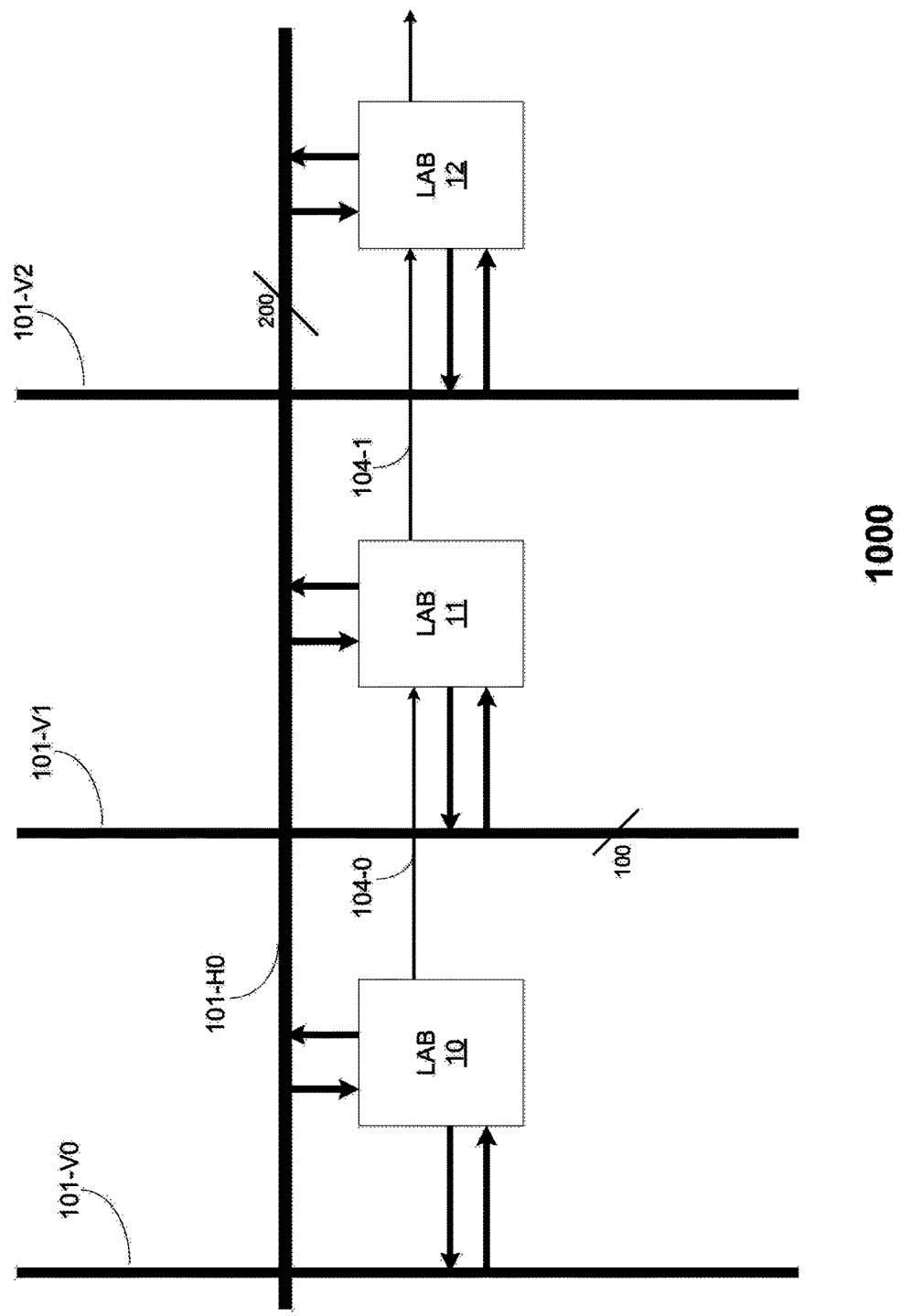
FIG. 1 illustrates routing and logic circuitry in a portion of an integrated circuit ("IC") in accordance with an embodiment of the present invention.

FIG. 1 illustrates routing and logic circuitry in a portion 1000 of an integrated circuit ("IC") in accordance with an embodiment of the present invention. Routing circuitry includes vertical channels 101-V0, 101-V1, and 101-V2 and horizontal channel 101-H0. In particular embodiments, each of these channels may comprise multiple wires that are shorter than the length of the entire channel, with starting and ending points that may be staggered. IC portion 1000 also includes logic regions arranged as logic array blocks ("LABs") (note that the term "LAB" generally includes both the logic region itself—a group of logic elements—and the routing interface associated with that logic region) including LAB 10, LAB 11, and LAB 12. In this example, for illustrative purposes only, each vertical channel includes 100 individual vertical routing lines and the illustrated horizontal channel includes 200 horizontal lines. The vertical and horizontal routing lines in each channel span a plurality of LABs. Output lines 104-0 and 104-1 are shown for carrying signals locally between adjacent logic regions. For example, lines 104-0 provide signal paths from LAB 10 to LAB 11 and lines 104-1 provide signal paths from LAB 11 to LAB 12.

Figure 2:
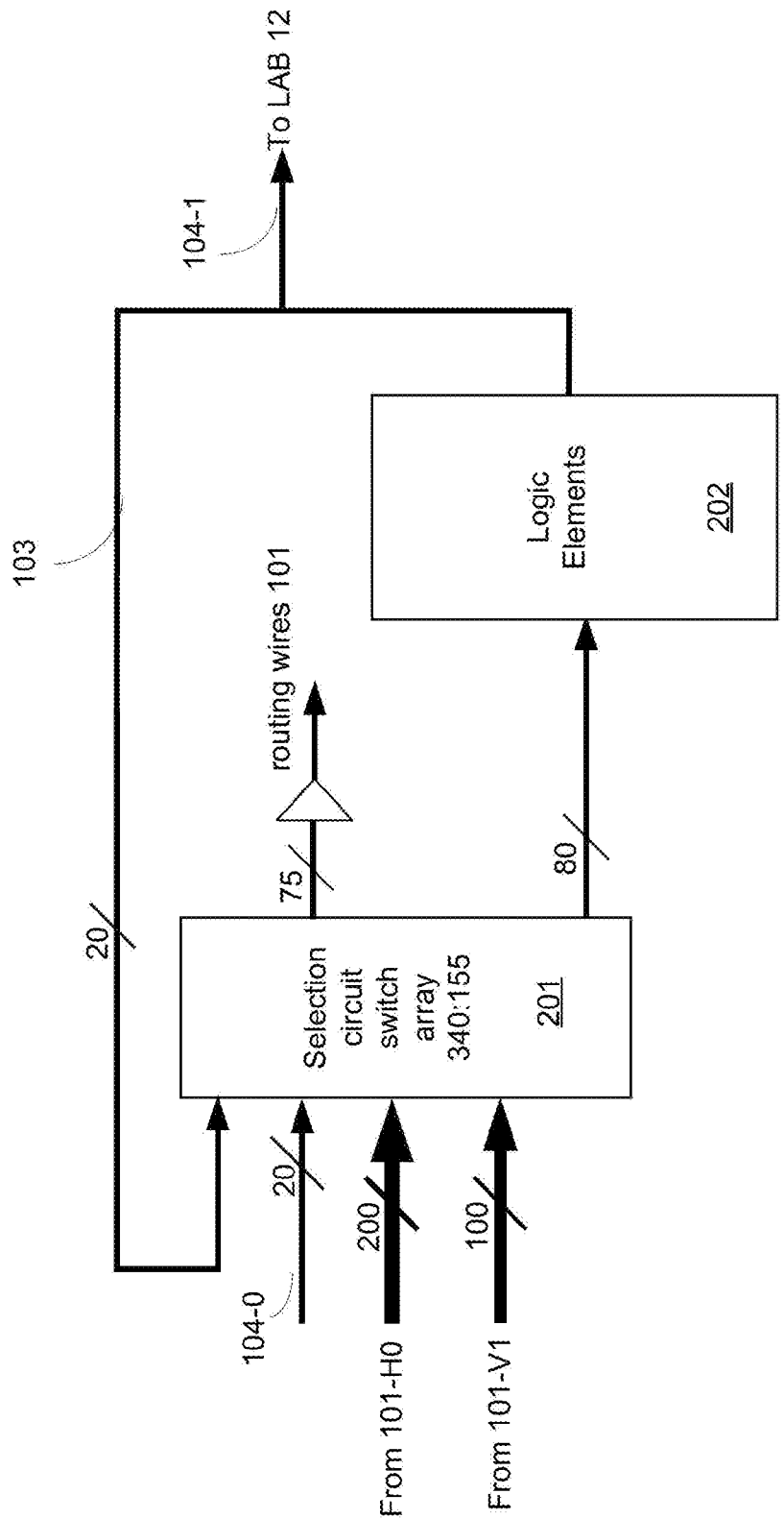
FIG. 2 illustrates further details of routing circuitry for one of the logical array blocks ("LABs") of FIG. 1.

FIG. 2 illustrates further details of routing circuitry for LAB 11 of FIG. 1. As illustrated in FIG. 2, LAB 11 includes selection circuit switch array 201 and logic elements 202. Note that the term "selection circuit" broadly refers to any circuit adaptable to selectively connect inputs and outputs. Sometimes the term "multiplexer" or "mux" is used herein to refer to a circuit that can map any input to one or more outputs. Under some usage in the art, "mux" is more strictly defined to refer to a selection circuit that has a single output and selects between many inputs (and a "demux" as a selection circuit that has a single input and selects between many outputs). In that sense, the term mux is used herein somewhat more broadly and would include what is sometimes referred to as a crossbar switch (though some muxes that are not constructed as an array would technically not be crossbar switches; thus, a particular crossbar switch might simply be considered a type of mux as that term is used herein); however, a mux would generally have fewer outputs than inputs whereas a crossbar switch may have an equal number of inputs and outputs (but may also have fewer outputs than inputs). To avoid such definitional issues, which are not relevant to the spirit and scope of the present invention in its broadest aspects, the broader term "selection circuit" is generally used to define embodiments of the invention, though occasionally the term "mux" is used for describing specific examples.

Selection circuit switch array 201 can be configured to select any one of 340 inputs for any one (or more) of 155 outputs. As illustrated, inputs to switch array 201 include:

100 inputs from the 100 vertical routing lines in vertical channel 101-V1; 200 inputs from the 200 routing lines of horizontal channel 101-H0; 20 inputs from the 20 outputs 104-0 (from adjacent LAB 10 in FIG. 1); and 20 inputs from the 20 wires 103 which provide outputs from logic elements 202 (individual logic elements not shown). Selection circuit switch array 201 provides 75 outputs to input drivers for routing wires 101 (which, in this example, includes some wires in horizontal channel 101-H0 and some wires in vertical channel 101-V1 illustrated in FIG. 1) and 80 outputs to inputs of logic elements 202. In particular, if the horizontal and vertical channel each include wires of logical length 4 (i.e., spanning four LABs), then ¼ of the total number of wires (200 horizontal channel wires and 100 vertical channel wires, i.e., 300 total wires), or 75 wires, need to be driven at each LAB location.

Selection circuit switch array 201, as illustrated in this particular embodiment, is considered to be a "single level" selection circuit because only one level of signal selection occurs between its inputs and outputs. In other words, 155 outputs are selected from 340 inputs without using two or more distinct selection circuits coupled in series to effect an intermediate selection of the initial inputs prior to a final selection. For example, by way of contrast, if a selection circuit was alternatively implemented by a combination of two selection circuits in series, e.g., a first circuit that selected 225 outputs from 340 inputs and a second circuit that selected 155 outputs from the 225 first circuit outputs, then such a combined selection circuit would be considered a two level selection circuit rather than a single level selection circuit.

Figure 3:
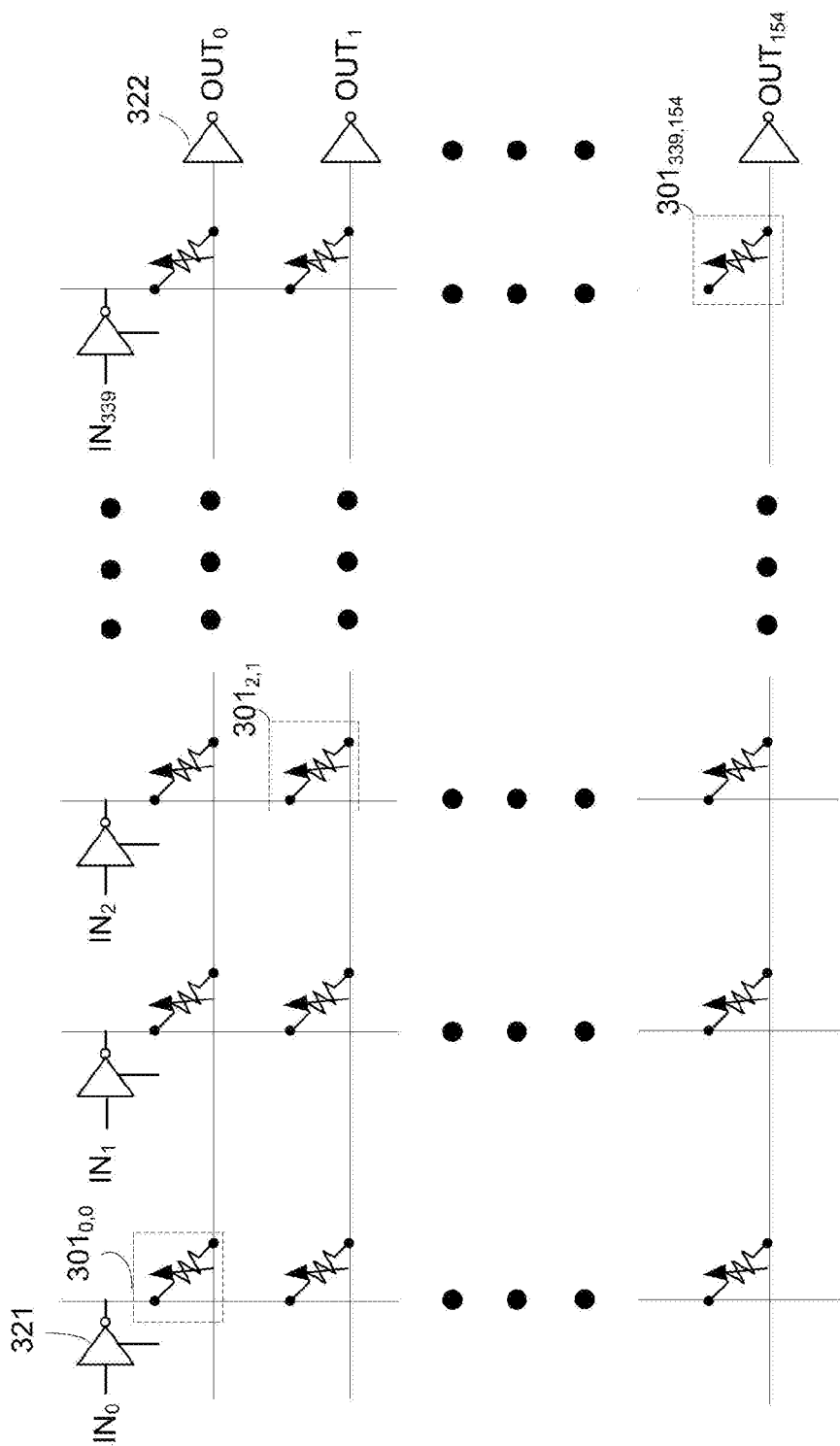
FIG. 3 illustrates further details of the selection circuit switch array of FIG. 2.

FIG. 3 illustrates further details of selection circuit switch array 201 of FIG. 2. Specifically, switch array 201 comprises a plurality of resistive switches 301 numbered from $301_{0,0}$ to $301_{339,154}$ (in this example, a total of 52,700 switches). Each switch 301 couples an input driver 321 (for a particular mux input) to an output driver 322 (for a particular mux output). Whether an input is selected for a particular output depends upon whether the switch 301 coupling the input to the output is programmed to be on (referenced herein as "on-programmed" or simply "programmed"). For example, to select $IN_0$ for $OUT_0$, switch $301_{0,0}$ is on-programmed; to select $IN_2$ for $OUT_1$, switch $301_{2,1}$ is on-programmed; and to select $IN_{339}$ for $OUT_{154}$, switch $301_{339,154}$ is on-programmed. Programming circuits per row and per column are not separately shown in FIG. 3.

Figure 4:
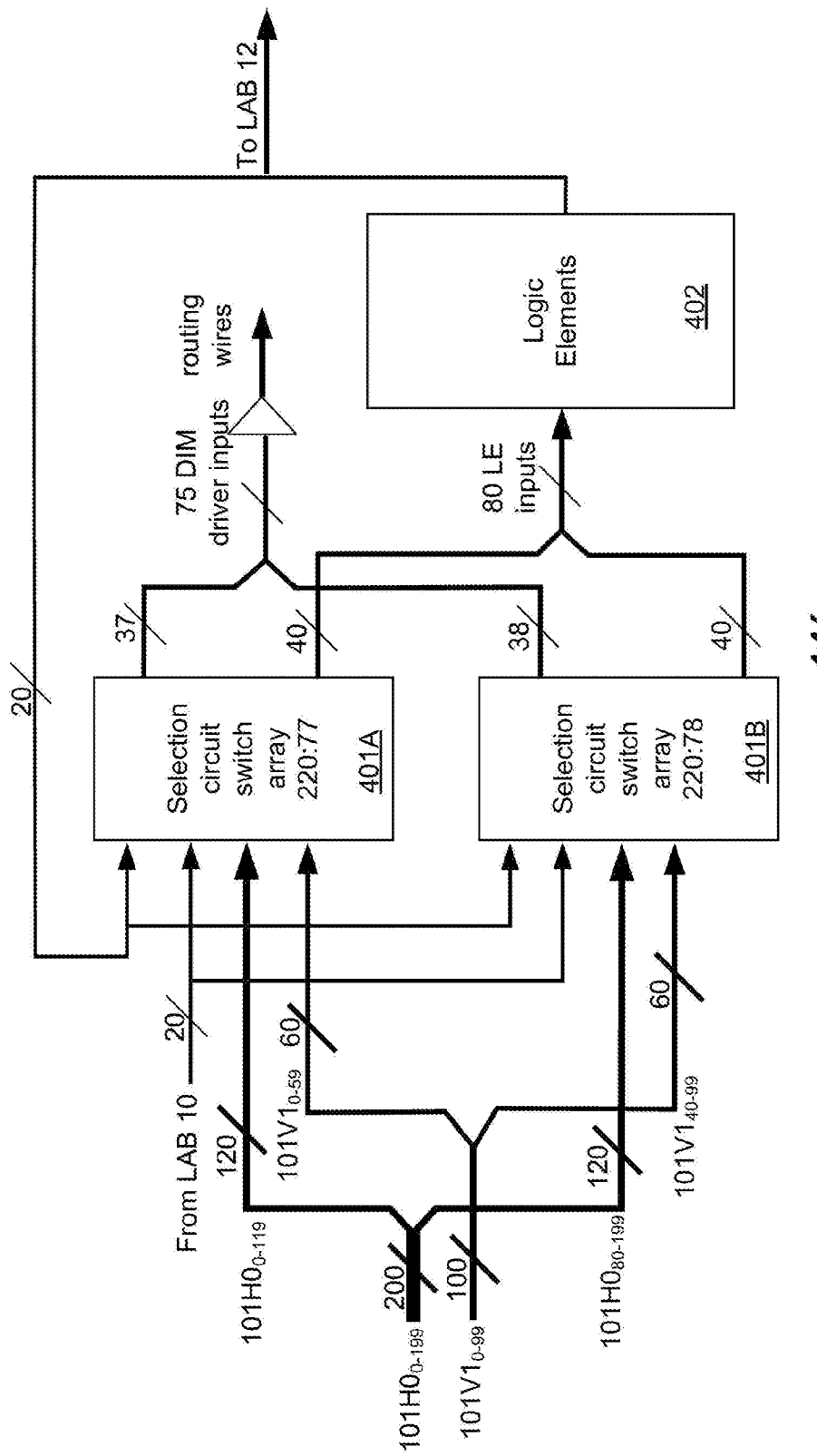
FIG. 4 illustrates an alternative embodiment to the routing circuitry illustrated in FIG. 2.

FIG. 4 illustrates a LAB that is an alternative embodiment to the LAB illustrated in FIG. 2. Specifically, FIG. 4 illustrates LAB 11' comprising selection circuit switch arrays 401A and 401B. As illustrated, switch array 401A receives: inputs from 20 outputs of logic elements 402 of LAB 11'; inputs from 20 of the logic element outputs in adjacent LAB 10; inputs from 120 of the 200 wires of H-channel 101-H0; and inputs from 60 of the 100 wires of V-channel 101-V1. Similarly, switch array 401B receives: inputs from 20 outputs of logic elements 402 of LAB 11'; inputs from 20 of the logic elements outputs in adjacent LAB 10; inputs from 120 of the 200 wires of H-channel 101-H0; and inputs from 60 of the 100 wires of V-channel 101-V1.

In the illustrated example, the same 20 logic element outputs from logic elements 402 of LAB 11' are provided to both switch array 401A and switch array 401B. Similarly, the same 20 logic element outputs from adjacent LAB 10 are provided to both switch array 401A and switch array 401B. An overlapping but not identical group of lines from H-channel 101-H0 are provided to inputs of switch arrays 401A and 401B. Specifically, in this example, H-channel lines include lines numbered from $101\text{-}H0_0$ to $101H0_{199}$. Lines $101\text{-}H0_{0\text{-}119}$ are provided to inputs of switch array 401A and lines $101\text{-}H0_{80\text{-}199}$ are provided to inputs of switch array 401B. Similarly, an overlapping but not identical group of lines from V-channel 101-V1 are provided to inputs of switch arrays 401A and 401B. Specifically, in this example, the V-channel lines are numbered from $101\text{-}V1_0$ to $101\text{-}V1_{99}$. Lines $101\text{-}V1_{0\text{-}59}$ are provided to inputs of switch array 401A and lines $101\text{-}V1_{40\text{-}99}$ are provided to inputs of switch array 401B.

Switch array 401A provides 37 outputs to inputs of drivers coupled to routing wires and 40 outputs to inputs of logic elements 402. Switch array 401B provides 38 outputs to inputs of drivers coupled to routing wires and 40 outputs to inputs of logic elements 402.

The design considerations for selecting an optimal implementation in a particular context are illustrated by comparing the benefits and costs of the embodiment of FIG. 4 relative to the embodiment of FIG. 2. For a given switch array, the number of switches is equal to the number of inputs multiplied by the number of outputs. Therefore, the embodiment of FIG. 4 allows for a smaller number of total switches by providing two smaller switch arrays arranged in parallel. In particular, the arrays of FIG. 4 could be implemented with (220)(77)+(220)(78)=34,100 total switches, which is approximately 35% fewer than are required for the embodiment of FIG. 2.

However, in the arrangement of FIG. 4, because each switch array (401A and 401B) provides output to a different set of resources and because some, but not all, of V-channel and H-channel routing resources are provided as input to both switch arrays, there are some connections that cannot be selected. Some resources, however, are connected to both switch arrays. In this particular example, as described above, 40 of the 200 H-channel lines (lines $101\text{-}H0_{80\text{-}119}$) that are routed to LAB 11' are provided to inputs of both switch array 401A and switch array 401B. Similarly, 20 of the 100 V-channel lines (lines $101\text{-}V1_{40\text{-}59}$) that are routed to LAB 11' are provided to both switch array 401A and switch array 401B. Because many routing inputs (some of the V-line and H-line inputs and all of the inputs from LE outputs in LAB 11' and LAB 10) are provided to both switch array 401A and switch array 401B, those two switch arrays together have a greater number of inputs in total (220+220=440 total inputs) than does switch array 201 of the embodiment of FIG. 2 (340 total inputs). This results in a larger number of columns that need to be programmed (as can be seen from FIG. 3, more total inputs would require more total columns of resistive switches) and hence a larger number of column programming drivers (column programming drivers are discussed further in the context of FIG. 5) are necessary to program the resulting programming grid (note that although the term "switch array" is referred to here in the context of particular selection circuits in an operational mode of the IC, for programming mode purposes, as described in further detail in the context of FIGS. 5-9, the switches in individual selection circuit switch arrays are part of a larger array of switches to be programmed).

Resistive switches themselves are extremely low cost in terms of space consumed on an IC. Therefore, the embodiment of FIG. 2 will be attractive for many implementations because it increases the number of connection options between particular resources. However, because programming resistive switches requires significant power (as further described in the context of FIGS. 5-9), there may, in some implementations, be advantages to limiting the total number of switches at the expense of having some resource connections into and out of a logic region being unavailable. The embodiment of FIG. 4 provides one example. However, alternative embodiments that include two or more parallel arrays for a single LAB may provide for a greater or lesser degree of overlap (or no overlap) of routing resource-to-LAB connections than that of the example illustrated in FIG. 4 without departing from the spirit and scope of the present invention.

Figure 5:
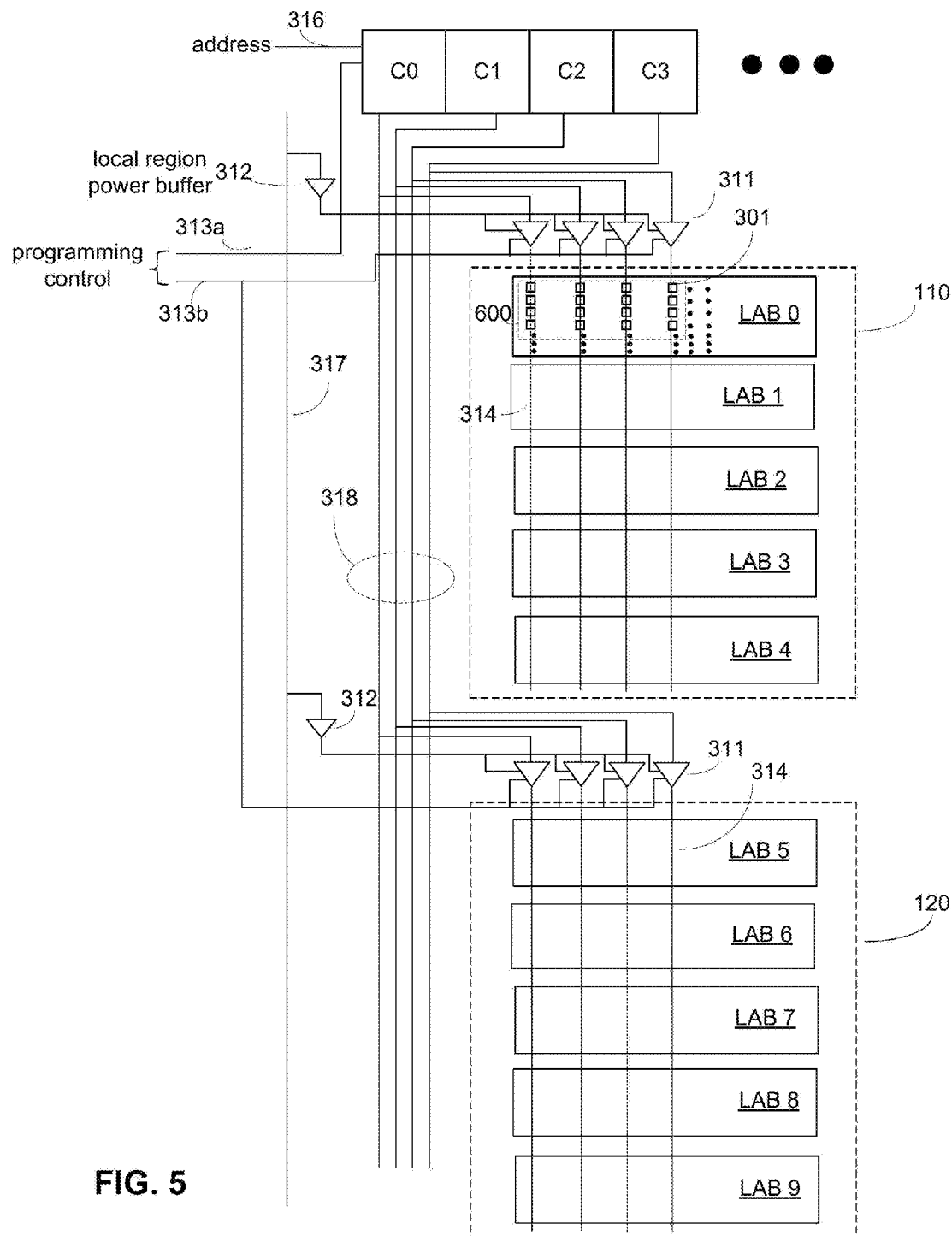
FIG. 5 illustrates a high level view of programming circuitry for programming resistive switches across a plurality of local programming regions in accordance with an embodiment of the present invention.

FIG. 5 illustrates a high level view of programming circuitry for programming resistive switches across a plurality of LAB local regions in accordance with an embodiment of the present invention. In particular, FIG. 5 illustrates a portion of local LAB regions 110 and 120. Local LAB region 110 includes LAB 0, LAB 1, LAB 2, LAB 3, and LAB 4. Similarly, local LAB region 120 includes LAB 5, LAB 6, LAB 7, LAB 8, and LAB 9. For ease of illustration, FIG. 5 illustrates only one column of LABs spanning the local regions. Resistive switches 301 are arranged to form a plurality of columns of resistive switches, each column of resistive switches is coupled to a column line 314 driven by a column line programming driver 311 within a local region. Address control is provided on line 316 and via additional circuitry to control address registers C0, C1, C2, C3 (each corresponding to a column in the array of resistive switches to be programmed) as well as other address registers not separately shown. When a particular column of resistive switches is to be programmed, a column select programming signal is provided from an address register for that particular column and a programming voltage is provided on a column line 314 by a column line programming driver 311. Programming control signals are provided on lines 313a and 313b. The signal on line 313a controls the address registers and the signal on line 313b enables the programming voltage driven on column lines 314 by programming drivers 311 for a selected column.

Programming voltages are delivered to respective column lines 314 via respective lines 318 and local column drivers 311. A local region power buffer 312 provides local buffering or regulation of a supply voltage delivered over line 317 to provide a supply voltage to each local column driver 311 in local programming regions 110 and 120. By providing local buffering of programming voltage signals and supply voltages in the manner illustrated, sufficient programming voltage levels can be maintained for programming all the resistive switches along an entire column of resistive switches within a programming region.

Figure 6:
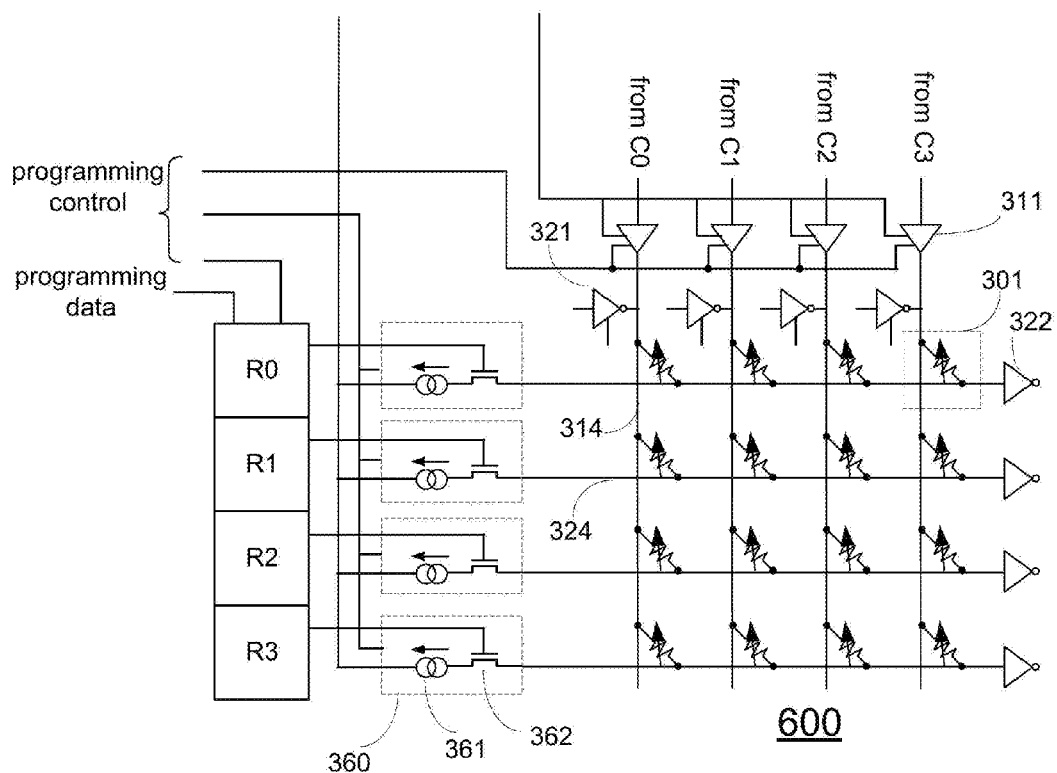
FIG. 6 illustrates further details of circuitry for programming a grid of resistive switches in accordance with an embodiment of the present invention.

FIG. 6 illustrates further details of circuitry for programming a grid of resistive switches. In particular, a 4×4 portion 600 (indicated in FIG. 5) of a larger grid of resistive switches is shown together with row and column programming circuitry for programming the rows and columns that include the illustrated switches as further described below.

The illustrated programming circuitry includes row driver circuits 360 for each row. Each row driver circuit 360 includes a current source driver 361 and an enable transistor 362. Also illustrated are row data registers R0, R1, R2, and R3. During programming operations, each of these registers is loaded with either a "1" or "0" programming bit indicating whether the switch in that particular row is to be "on-programmed." For example, if row data register R2 is loaded with a "1" (i.e., whatever the binary high voltage signal level is) then, during a programming cycle, that signal will be applied to the gate of the enable transistor 362 to which register R2 is coupled. This in turn will cause the corresponding current source driver 361 to drive a current on the corresponding row line 324.

During programming, data in one of the address registers (e.g., C0, C1, C2, C3) indicates a column to be selected for programming during a programming cycle. For the selected column, a corresponding column line 314's driver 311 will drive a high voltage on the selected column line 314 (i.e., in the column to be programmed). For example, if column address register C1's value indicates that its column is selected, a high value will be driven on the column lines 314 in column C1 (as illustrated, a line 314 in local region 110 and a line 314 in local region 120) and resistive switches in rows of that column whose row data registers are holding a "1" for that programming cycle (for example, the resistive switch in the row corresponding to row register R2) will be on-programmed. Specifically, the local column programming driver for a selected column and a row programming driver are coupled to a resistive switch to be on-programmed and these drivers operate to maintain a programming voltage difference across the resistive switch.

In the illustrated embodiment, column lines 314 may experience significant loads during programming, particularly if many resistive switches are coupled to a single column line and if many of those switches are selected to be on-programmed in the same programming cycle. Therefore, voltage levels along the line might vary, decreasing at points along a column line as the distance from the local programming driver 311 increases. For this reason, in one aspect, an embodiment of the present invention uses current sources 361 (rather than voltage sources) as part of row programming driver circuits 360. This helps maintain more consistent current flows through each resistive switch that is to be on-programmed even if the voltage level provided along the column line varies. This allows for providing greater voltage differences at the drivers to compensate for a drop along the column line while limiting the voltage difference across and the current through switches to be on programmed to appropriate levels. For example, in one embodiment, a voltage difference provided between a row driver and a column driver is greater than a programming voltage. However, a current source driving the row limits the voltage across and the current through a resistive switch that is to be on-programmed to the appropriate programming voltage and current levels.

In the present embodiment, voltage source programming drivers are provided for driving the column lines and current source programming drivers are provided for driving the row lines. However, in alternative embodiments consistent with this aspect of the present invention, current source programming drivers may be provided on the column lines and voltage source drivers may be provided on the row lines. Furthermore, in some such alternatives, voltage source row programming drivers may simply be a connection to ground or other means of providing a "low" voltage value on the row line.

Moreover, in some implementations consistent with other aspects of the present invention, both row and column programming drivers might include a voltage source driver, one providing a high voltage source and another providing a low voltage source. For example, if programming regions are divided into local programming regions as illustrated in the embodiment of FIG. 5, each column line might be used for programming a small enough number of resistive switches that a sufficiently uniform programming voltage may be maintained along the length of the line without using current source drivers for the row or column programming drivers.

Although aspects of embodiments of the present invention are described in the context of a rows and columns of resistive switches and rows and column of logic regions (in which, for example, "horizontal" routing routes generally in the direction of the row and "vertical" routing is generally oriented to span multiple rows and/or route in the direction of a column), it should be understood that, because the terminology of rows and columns is relative to the orientation of the device, one may interchange the words row and column by merely rotating a device 90 degrees. Furthermore, although the terms "row" and "column" are typically associated with a straight-line arrangement of items, alternative embodiments may employ row or column arrangements that are curved, or partially curved, or that have occasional jogs or gaps, or that do not span an entire region of an IC without necessarily departing from the spirit and scope of the present invention.

Figure 7:
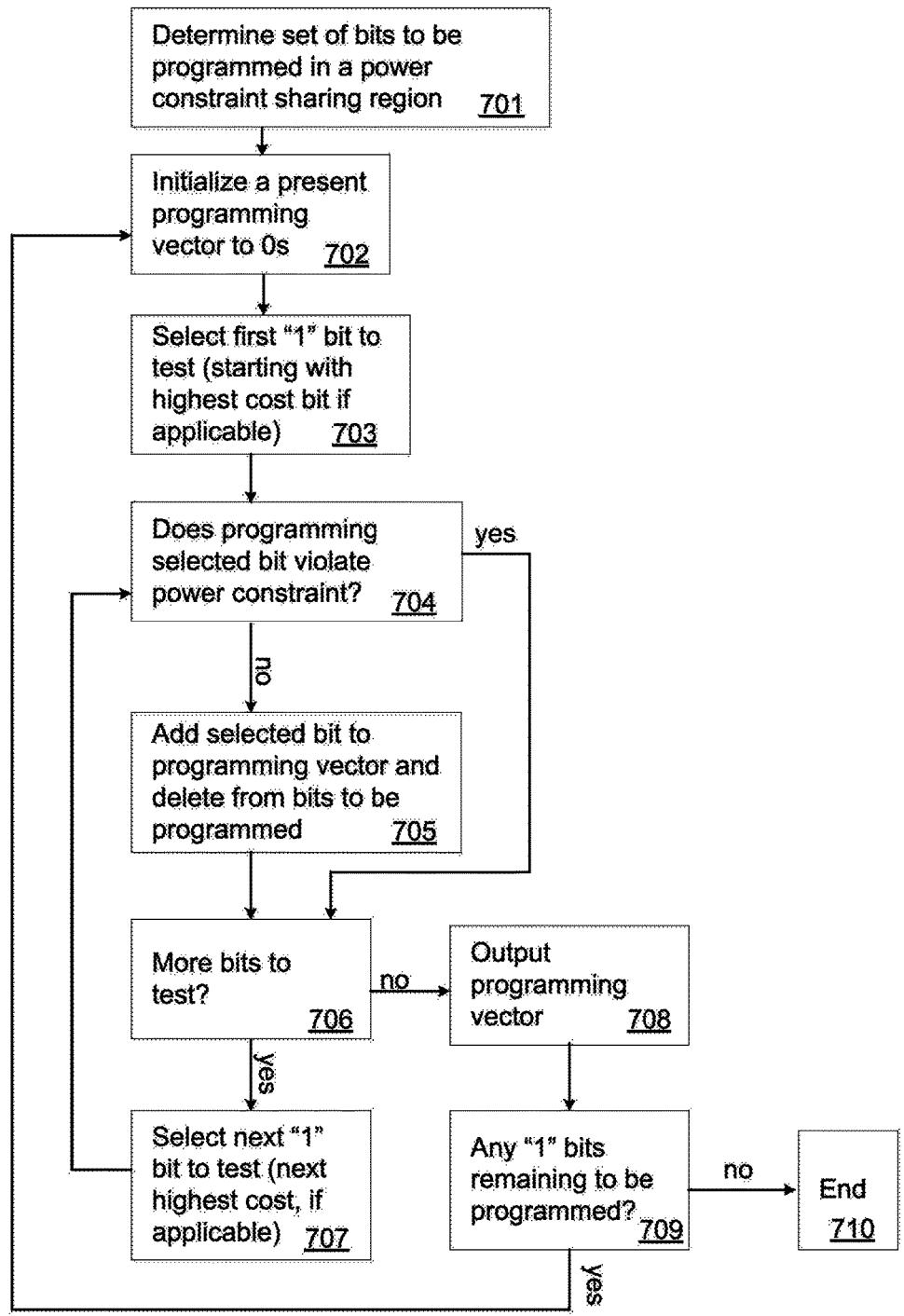
FIG. 7 illustrates a method for generating programming vectors for programming resistive switches. The method is in accordance with an embodiment of the present invention.

FIG. 7 illustrates a method 700 consistent with an embodiment of the present invention. Because resistive switches require significant power levels to accomplish programming, it may be desirable to implement power constraints for each programming cycle. This in turn may result in limits on how many resistive switches can be on-programmed in a single programming cycle and, therefore, multiple cycles for programming a single column of resistive switches may be required. Method 700 provides steps for accomplishing the programming of a resistive switch array when such programming cycle power constraints are necessary or desirable.

As used herein, the term "programming vector" simply means a set of programming data values to be loaded into row registers for use during a programming cycle to program rows in a column of resistive switches within a region to which one or more power constraints is applied (such a region will be referred to herein as a "power constraint sharing region"). With reference to the embodiment of FIG. 5, a column might span multiple local regions and thus might include resistive switches along multiple column lines within the same column. In the context of the method illustrated in FIG. 7 and the sample programming vectors illustrated in FIGS. 8-9, for ease of explanation, it is assumed that programming vectors include a "1" value if the switch in a particular row is to be on-programmed and a "0" if the switch is not to be on-programmed. Power levels for a programming cycle generally depend on the number of switches to be on-programmed and so a "1" bit in a programming vector can affect the total power cost of a particular programming cycle. In typical prior art methods for programming field programmable gate arrays ("FPGAs"), a column of configuration elements (which are often, but not necessarily, implemented as static random access memory or "SRAM" cells) are programmed in a single programming clock cycle (assuming the row programming data has already been loaded into the row data register elements). By contrast, method 700 provides for multiple programming vectors if necessary given power constraints and the multiple vectors can be used to program a single column of switches in multiple programming cycles.

Step 701 determines the set of bits to be programmed in a column of a power constraint sharing region. Step 702 initializes a present programming vector to 0s, meaning that this part of the method begins with a vector of programming data that is initially assumed to include only 0s. As the method progresses, some of the 0s in the programming vector are set to 1s if doing so does not violate a power constraint as will be further described. Step 703 selects the first 1-bit of bits to be programmed (note, those skilled in the art will understand that sometimes herein a "1-bit" is simply referred to as a "bit" for convenience in this context; though technically, in other contexts, a "bit" may refer to a bit whose value is either 1 or 0). If the power cost of programming resistive switches varies by row, then bits (i.e., 1-bits) to be programmed (i.e., that correspond to resistive switches to be programmed) should be tested in order from highest to lowest cost bit (this is further explained in the context of FIG. 9 and accompanying text). Step 704 determines whether programming that the selected bit (which results in on-programming the corresponding resistive switch) would violate a pre-determined power constraint. If yes, the method proceeds to step 706 which determines whether there are any more bits to test among the bits to be programmed. If the result of step 704 is no, then the method proceeds to step 705 and the selected bit is added to the programming vector (i.e., a "0" for that row in the programming vector is changed to a "1"). Also, the bit is removed from the bits to be programmed (i.e., a "1" in the bits to be programmed is changed from a "1" to a "0"). The method then proceeds to step 706 which, as just described, determines whether there are more bits to be programmed in the column that have not yet been tested.

If the result of step 706 is yes, then the method proceeds to step 707 and the next 1-bit to test is selected (taking the next highest cost bit, if power cost varies by row, as further explained in the context of FIG. 9) and the method returns to step 704. If the result of step 706 is no, then the method proceeds to step 708 which outputs a programming vector. Step 709 determines whether there are any more 1-bits to be programmed. If yes, then the method returns to step 702 to begin creating an additional programming vector. If no, then the method ends at step 710. Once step 710 is reached, one or more programming vectors have been created that can be used to program an entire column.

FIG. 8 shows a table 800 to illustrate an example of programming vectors resulting from carrying out method 700 under a particular power constraint. The power constraint applied in creating the vectors illustrated in table 800 includes two simple linear constraints: Rule 1 is that a power cost of no more than 2 units (generic units for purposes of conceptual explanation) may be incurred per cycle in a column within a local programming region (in the context of the FIG. 5 illustration, that would refer to switches along a single local column line 314 within one of the local programming regions—region 110 or region 120). Rule 2 is a global constraint that a power cost of no more than 5 units may be incurred per cycle in an entire power constraint sharing region (in the context of FIG. 5, the region supplied by global column line 317). In the context of the example illustrated in FIG. 8 it is assumed that programming a resistive switch in any row has a cost of 1 unit.

The example of FIG. 8 assumes four local regions in the applicable power constraint sharing region and, for simplicity and ease of explanation only, each local column region is assumed to include ten rows of switches (an actual implementation would likely include many more rows of switches in a single local region and might include more or fewer local regions). Specifically, FIG. 8 assumes a first local region 80 (rows R0-R9), a second local region 81 (rows R10-R19), a third local region 82 (rows R20-R29), and a fourth local region 83 (rows R30-R39).

Column 801 of table 800 illustrates a sample set of bits to program. As indicated, resistive switches in rows R1, R2, R4, R6, R7, R10, R14, R15, R18, R22, R25, R26, R27, R31, and R39 are to be on-programmed. Applying method 700 and the above referenced power constraint (Rule 1: max cost of 2 units per local region; Rule 2: max cost of 5 units total for the entire programming region) yields an initial programming vector, ("Vector 1"), shown in column 802 of table 800. Vector 1 programs the bits in rows R1, R2, R10, R14, and R22. Note that in applying method 700 to evaluate the "bits to program" for potentially adding to Vector 1, bits in rows R1 and R2 would initially be tested and found not to violate the Rule 1 or the Rule 2 power constraint and therefore would be added to Vector 1. However, when the bits in rows R4, R6, and R7 are tested, they violate the Rule 1 power constraint and are thus not added to Vector 1. Similarly, the bits in row R10 and R14 can be added to Vector 1 but not the bits in rows R18 and R19. The bit in row R22 can be added to Vector 1, but then the Rule 2 limit is reached (5 bits total) and so none of the other tested bits can pass the power constraint and be added to Vector 1.

After Vector 1 is determined, then, as illustrated in column 803 of table 800, the on-programming bits remaining to be programmed are in rows R4, R6, R7, R15, R18, R25, R26, R27, R31, and R39. Continuing to apply the Rule 1 and Rule 2 constraint and using the method of FIG. 7 allows bits in rows R4, R6, R15, R18, and R25 to be added to a second vector ("Vector 2," shown in column 804 of table 800). After Vector 2 is determined, the on-programming bits remaining to be programmed are, as illustrated in column 805 of table 800, rows R7, R26, R27, R31, and R39. Continuing to apply the Rule 1 and Rule 2 constraint and using the method of FIG. 7 allows bits in rows R7, R26, R27, R31, and R39 to be added to a third vector, Vector 3 (shown in the column 806 of table 800). After Vector 3 is determined, then there are no more on-programming bits remaining to be programmed as illustrated in column 807 of table 800. Thus Vector 1, Vector 2, and Vector 3 can be used to program the column in three programming cycles.

FIG. 9 shows a table 900 to illustrate another example of programming vectors resulting from carrying out method 700 given a particular power constraint. For simplicity, the example illustrated in FIG. 9 shows a single local column region and assumes the only power constraint is local. Specifically, the example of FIG. 9 assumes that a total power cost of 3 units can be incurred for each programming cycle. However, while the example of FIG. 8 assumed that the power cost of programming a resistive switch was the same in each row, the example of FIG. 9 assumes that the power cost increases the further away the row is from the column programming driver, which might approximate the voltage drop along the programming wire. The cost is assumed to be of the form 1+i/10 where "i" is the row number.

Column 901 of table 900 shows the cost of programming each row. Column 902 shows that the bits to be programmed are in rows R1, R2, R4, R5, R7, and R8. Applying method 700, row R8 is tested first. Testing the costliest row first allows the possibility of more efficiently pairing more expensive rows with inexpensive rows which, in some cases, may allow the total number of vectors (and hence programming cycles) necessary to program a column to be reduced. As indicated by column 903 of table 900, testing the rows using method 700 from costliest to least costly results in Vector 1 in which rows R8 and R2 are programmed.

After Vector 1 is created, the bits remaining to be programmed, as indicated in column 904 of table 900, are in rows R1, R4, R5, and R7. Continuing to apply the power constraint (no more than a cost of 3 units per vector) and method 700 results in Vector 2 as shown in column 905. Vector 2 programs rows R1 and R7. After Vector 2 is created, the bits remaining to be programmed are, as shown in column 906, in rows R4 and R5. Since the cost of these bits totals 2.9 units, they can be programmed with one additional vector, Vector 3, as shown in column 907. As shown in column 908, after Vector 3 is created, no more on-programming bits remain to be programmed.

Programmable resistive switch arrays and associated routing and programming circuitry illustrated herein may be implemented as part of any IC. A specific example of an IC is an FPGA. FPGAs (also referred to as programmable logic devices ("PLDs"), complex PLDs, programmable array logic, programmable logic arrays, field PLAs, erasable PLDs, electrically erasable PLDs, logic cell arrays, or by other names) provide the advantages of fixed ICs with the flexibility of custom ICs. FPGAs have configuration elements (i.e., programmable elements) that may be programmed or reprogrammed. Placing new data into the configuration elements programs or reprograms the FPGA's logic functions and associated routing pathways. Such configuration may be accomplished via data stored in programmable elements on the IC. Programmable elements may include dynamic or static RAM, flip-flops, electronically erasable programmable read-only memory (EEPROM) cells, flash, fuse, anti-fuse programmable connections, or other memory elements. Configuration may also be accomplished via one or more externally generated signals received by the IC during operation of the IC. Data represented by such signals may or may not be stored on the IC during operation of the IC. Configuration may also be accomplished via mask programming during fabrication of the IC. While mask programming may have disadvantages relative to some of the field programmable options already listed, it may be useful in certain high volume applications.

Figure 10:
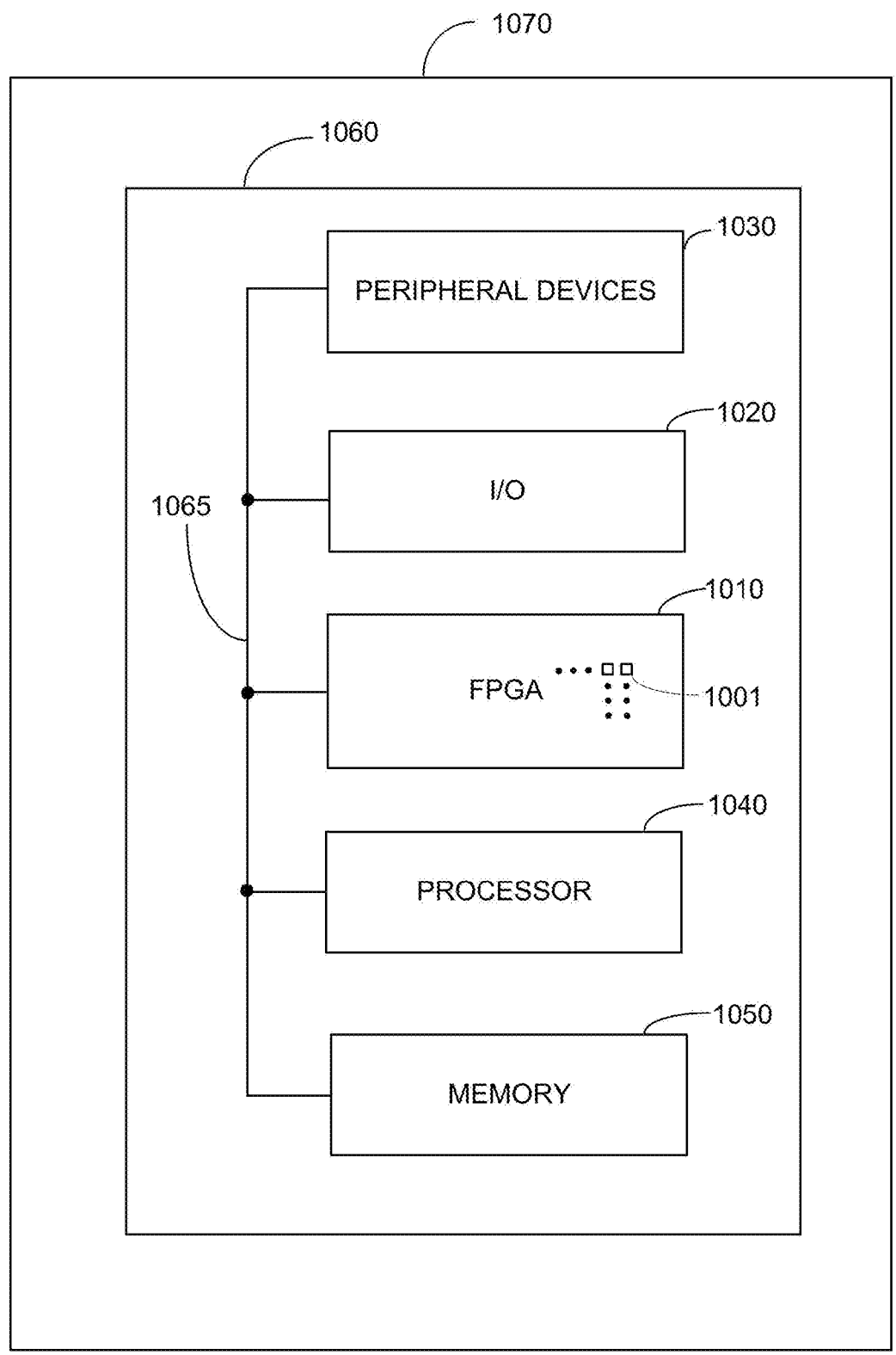
FIG. 10 illustrates an exemplary data processing system including a field programmable gate array ("FPGA") with circuitry in accordance with an embodiment of the present invention.

FIG. 10 illustrates an exemplary data processing system 1000 including an FPGA 1010. FPGA 1010 includes programmable circuitry including resistive switches 1001 and programming and routing circuitry in accordance with the principles of embodiments illustrated in FIGS. 1-6 herein (not separately shown in FIG. 10).

Data processing system 1000 may include one or more of the following additional components: processor 1040, memory 1050, input/output (I/O) circuitry 1020, and peripheral devices 1030 and/or other components. These components are coupled together by system bus 1065 and are populated on circuit board 1060 which is contained in end-user system 1070. A data processing system such as system 1000 may include a single end-user system such as end-user system 1070 or may include a plurality of systems working together as a data processing system.

System 1000 can be used in a wide variety of applications, such as computer networking, data networking, instrumentation, video processing, digital signal processing, or any other application where the advantage of using programmable or reprogrammable logic in system design is desirable. FPGA 1010 can be used to perform a variety of different logic functions. For example, FPGA 1010 can be configured as a processor or controller that works in cooperation with processor 1040 (or, in alternative embodiments, an FPGA might itself act as the sole system processor). FPGA 1010 may also be used as an arbiter for arbitrating access to shared resources in system 1000. In yet another example, FPGA 1010 can be configured as an interface between processor 1040 and one of the other components in system 1000. It should be noted that system 1000 is only exemplary.

Figure 11:
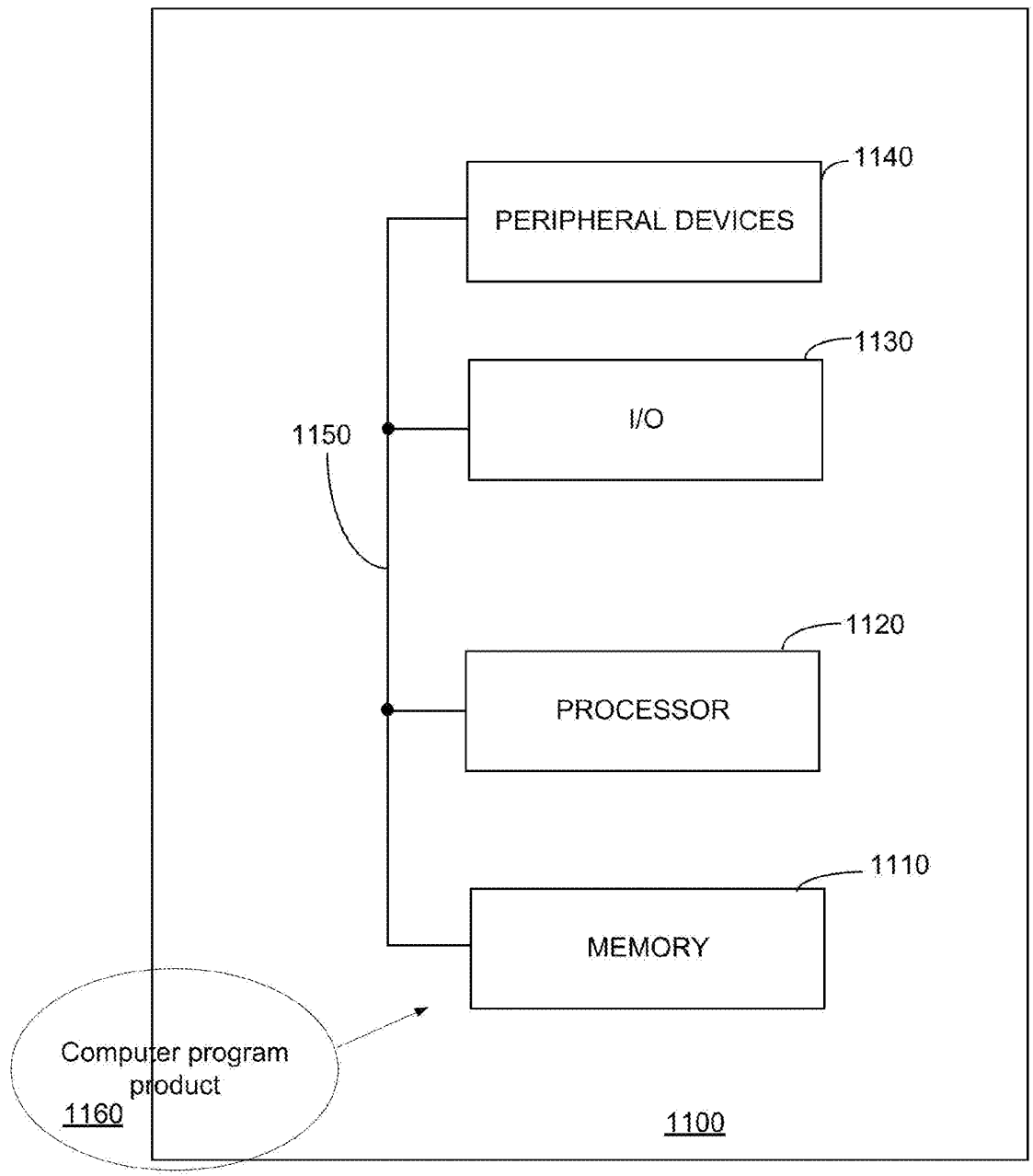
FIG. 11 shows an example of a computer system that may be used to execute instruction code contained in a computer program product, the computer program product being in accordance with an embodiment of the present invention.

FIG. 11 shows an example of a computer system 1100 that may be used to execute instruction code contained in a computer program product 1160 in accordance with an embodiment of the present invention. Computer program product 1160 comprises executable code in an electronically readable medium that may instruct one or more computers such as computer system 1100 to perform processing that accomplishes the exemplary method 700 of FIG. 7. The electronically readable medium may be any non-transitory medium that stores information electronically and may be accessed locally or remotely, for example via a network connection. The medium may include a plurality of geographically dispersed media each configured to store different parts of the executable code at different locations and/or at different times. The executable instruction code in an electronically readable medium directs the illustrated computer system 1100 to carry out various exemplary tasks described herein. The executable code for directing the carrying out of tasks described herein would be typically realized in software. However, it will be appreciated by those skilled in the art, that computers or other electronic devices might utilize code realized in hardware to perform many or all of the identified tasks without departing from the present invention. For example, some of the logic for carrying out the programming methods herein may be realized in hardware within a configuration controller on an FPGA or other IC to be programmed or on a companion configuration memory device. Those skilled in the art will understand that many variations on executable code may be found that implement exemplary methods within the spirit and the scope of the present invention.

The code or a copy of the code contained in computer program product 1160 may be stored in memory 1110 for execution by processor 1120. Computer system 1100 also includes I/O subsystem 1130 and peripheral devices 1140. I/O subsystem 1130, peripheral devices 1140, processor 1120, and memory 1110 are coupled via bus 1150.

Those skilled in the art will appreciate computer system 1100 illustrates just one example of a system in which a computer program product in accordance with an embodiment of the present invention may be implemented. To cite but one example of an alternative embodiment, execution of instructions contained in a computer program product in accordance with an embodiment of the present invention may be distributed over multiple computers, such as, for example, over the computers of a distributed computing network.

ADDITIONAL EMBODIMENTS

An integrated circuit ("IC") comprising: a plurality of logic regions and routing means for routing signals into and out of the logic regions. An IC comprising programming circuitry means for programming an array of resistive switches.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but only by the following claims.

What is claimed is:

1. Routing circuitry in an integrated circuit comprising:
a vertical channel having a first plurality of routing lines;
a horizontal channel having a second plurality of routing lines;
a first logic region having a first plurality of logic elements;
a second logic region adjacent to the first logic region having a second plurality of logic elements;
a single level selection circuit switch array coupled to the vertical channel, to the horizontal channel, to inputs of the first plurality of logic elements, and to outputs of the second plurality of logic elements through routing lines other than the routing lines of the first and second pluralities of routing lines; and
an additional single level selection circuit switch array, wherein the single level selection circuit switch array is further coupled to a first portion of the first plurality of routing lines and to a first portion of the second plurality of routing lines, and wherein the additional single level selection circuit switch array is coupled to a second portion of the first plurality of routing lines and to a second portion of the second plurality of routing lines.

2. The routing circuitry of claim 1, wherein the single level selection circuit switch array is further coupled to outputs of the first plurality of logic elements.

3. The routing circuitry of claim 1, wherein the single level selection circuit switch array comprises a resistive switch array.

4. The routing circuitry of claim 3, wherein the resistive switch array selectively connects any input of the resistive switch array to any output of the resistive switch array.

5. The routing circuitry of claim 1, wherein the additional single level selection circuit switch array is further coupled the first and second pluralities of logic elements.

6. The routing circuitry of claim 5, wherein some routing lines of first portion of the first plurality of routing lines are included in the second portion of the first plurality of routing lines, and wherein some routing lines of the first portion of the second plurality of routing lines are included in the second portion of the second plurality of routing lines.

7. Routing circuitry in an integrated circuit comprising:
a vertical channel having a first plurality of routing lines;
a horizontal channel having a second plurality of routing lines;
a first logic region having a first plurality of logic elements;
a second logic region adjacent to the first logic region having a second plurality of logic elements;
a resistive switch array coupled to the vertical channel, to the horizontal channel, and to inputs of the first plurality of logic elements, wherein resistive switch elements of the resistive switch array occupy less die space per element of the integrated circuit than would be occupied by configuration random access memory and pass transistor switch programmable elements on the integrated circuit; and
an additional resistive switch array, wherein a portion of the first plurality of routing lines is coupled to both the resistive switch array and the additional resistive switch array, and wherein the first plurality of logic elements directly receives signals from the resistive switch array and the additional resistive switch array.

8. The routing circuitry of claim 7, wherein the resistive switch array is further coupled to outputs of the first plurality of logic elements.

9. The routing circuitry of claim 7, wherein the resistive switch array is further coupled to another portion of the first plurality of routing lines and to a first portion of the second plurality of routing lines, and wherein the additional resistive switch array is coupled to yet another portion of the first plurality of routing lines and to a second portion of the second plurality of routing lines.

10. The routing circuitry of claim 9, wherein the additional resistive switch array is further coupled the first and second pluralities of logic elements.

11. The routing circuitry of claim 7, wherein a portion of the second plurality of routing lines is coupled to both the resistive switch array and the additional resistive switch array.

* * * * *